United States Patent [19]

D'Amato

[11] Patent Number: 4,996,939
[45] Date of Patent: Mar. 5, 1991

[54] APPARATUS FOR DRYING PRINTED CIRCUIT BOARDS

[75] Inventor: Mark D'Amato, Montreal, Canada

[73] Assignee: D.E.M. Controls of Canada, Inc., Montreal, Canada

[21] Appl. No.: 358,870

[22] Filed: May 26, 1989

Related U.S. Application Data

[63] Continuation-in-part of Ser. No. 267,044, Nov. 3, 1988, Pat. No. 4,895,099.

[51] Int. Cl.⁵ .............................................. B05C 11/00
[52] U.S. Cl. ...................................... 118/65; 118/114; 34/78; 34/18; 29/120
[58] Field of Search ........................ 118/58, 63, 65, 50, 118/61, 119, 114–117; 34/77, 18; 29/121

[56] References Cited

U.S. PATENT DOCUMENTS

| | | | |
|---|---|---|---|
| 367,242 | 7/1887 | Schwartz | 118/117 |
| 1,174,995 | 3/1916 | Kremer | 118/115 |
| 1,264,358 | 4/1918 | Willwerscheid | 118/63 |
| 2,391,195 | 12/1945 | Ross et al. | 34/17 |

Primary Examiner—Bernard Nozick
Attorney, Agent, or Firm—Stetina & Brunda

[57] ABSTRACT

Disclosed is an apparatus for drying printed circuit boards or similar workpieces. The dryer apparatus comprises an "aspirator" portion of a "blower" portion. The aspirator portion of the apparatus is operative to create negative pressure or suction upon the surfaces of circuit boards as they pass along a fixed conveyor path. The blower portion of the apparatus is operative to pass drying air over the surfaces of the advancing circuit boards after they have been subjected to the negative pressure or suction force of the aspirator. The "aspirator" and "blower" portions of the apparatus may be enclosed in a substantially air-tight housing or cabinet so as to provide for substantially self-contained recirculation of air therewithin.

21 Claims, 2 Drawing Sheets

APPARATUS FOR DRYING PRINTED CIRCUIT BOARDS

RELATED INVENTIONS

The subject application is a continuation-in-part of patent application Ser. No. 267,044, filed on Nov. 3, 1988 now U.S. Pat. No. 4,895,099, entitled METHOD AND DEVICE FOR SEQUENTIAL SPRAY APLICATION OF CHEMICAL SOLUTIONS USED IN THE PREPARATION OF CIRCUIT BOARD INNER LAYERS, which application is presently pending before the United States Patent and Trademark Office.

INCORPORATION BY REFERENCE

The entire disclosure of Applicant's issued U.S. Pat. No. 4,895,099 is incorporated herein by reference.

BACKGROUND OF THE INVENTION

The present invention relates generally to the art of chemical processing and more particularly to a method and device for extracting liquid from and/or drying printed circuit boards and similar items.

The drying apparatus of the present invention has particular utility in the manufacture of printed circuit boards and will be described herein with particular reference to such applications. It will be appreciated, however, that the drying apparatus of the present invention may enjoy very broad applicability and may be useful in drying/removing liquid from many different types of workpieces other than circuit boards or portions thereof.

In the routine manufacture of printed circuit boards it is common practice to subject the circuit boards or portions thereof, to various liquid chemical treatments and/or water rinses. Following such liquid treatments and/or water rinses, it is generally desirable to effectuate thorough and complete drying of the circuit board so as to prevent subsequent defects and/or processing problems which are known to occur when residual liquid is allowed to remain thereon.

For example, one process wherein the inner layer components of multilayer circuit boards are subjected to numerous liquid treatments and rinses is the "Method for Sequential Spray Application of Chemical Solutions used in the Manufacture of Circuit Board Inner Layers" described in U.S. patent application Ser. No. 267,044. Specifically, the method described in application Ser. No. 267,044 involves subjecting circuit board inner layers to sequential application of four (4) chemical treatment solutions with intermittent water rinses. The final solution applied in accordance with the method of application Ser. No. 267,044 is a "post-treatment solution" which comprises a silane coupling agent. (e.g. Durabond TM 600 PT, E. I. duPont de Nemours, Co., Wilimington, Del.) The silane molecules of such post-treatment solution are intended to chemically bond to tin atoms plated on the surfaces of the inner layers. Thereafter, epoxy adhesive applied to the surface of the board will chemically bond to other sites on the silane molecules. As such, the silane material, in order to be effective in its "coupling" function, must concomitantly bind to the epoxy and the tin atoms plated upon the inner layer surface. Such concomitant binding of the epoxy and the tin by the silane allows the silane to promote firm adhesion of the epoxy adhesive to the underlying inner layer. Accordingly, it is important that the silane containing post-treatment solution be evenly disposed in a thin, even layer over the surfaces of the circuit board inner layers prior to drying thereon. Uneven or excessive deposits of non-tin bound silane, if allowed to remain upon surfaces of the inner layers, may result in separation, delamination, resultant adhesive failure and/or other problems with the finished multilayer circuit board may result. It is desirable that the liquid silane coupling agent solution be metered or spread to an even film upon the surface of the inner layers, such film being preferably of a thickness within the range of approximately 1/10 to 1 mils. If the desired, evenly distributed film of silane solution is subsequently streaked, smudged, or disrupted prior to solvent evaporation/drying thereof, the result may be just as undesirable as if the liquid silane film had not been metered or distributed in the first place. (i.e. the dried silane coating may be too thick in some areas and not thick enough in others.) Thus, in drying the inner layer, care should be taken to avoid excessive impingement of blown air onto the inner layer surfaces as such may result in streaking, rippling, or other disruption of even a properly distributed and evenly metered liquid silane film.

In addition to the method described in application Ser. No. 267,044, various other circuit board manufacturing processes also require efficient extraction of liquid and/or drying of the circuit board surfaces. Examples of other processes wherein drying is critical include, but are not limited to; chemical etching operations, chemical oxidation operations, pumice scrubbing-/surface abrasion operations, etc.

The routine drying of liquid laden circuit boards is sometimes made more difficult by inherent structural attributes of the boards themselves. For example, many circuit boards are provided with numerous small holes, apertures or perforations to facilitate subsequent mounting of electrical components. Particular problems are apt to arise when attempting to dry such foraminous circuit boards because residual liquid tends to accumulate and/or collect within the individual holes, apertures or perforations. As a result, standard drying techniques (e.g. blowing heated air over the surface of the circuit board) may fail to adequately extract and/or evaporate liquid from the individual holes, apertures or perforations. Failure to extract and/or dry all liquid from the apertures may interfere with subsequent steps in the manufacture of the circuit board due to the presence of the liquid itself and/or subsequent gassification of the liquid as may cause blowing or surface defects in coatings, delamination, etc.

In view of the above-described shortcomings of the prior art there exists a compelling need for improved circuit board drying equipment capable of extracting and/or drying liquids disposed on the surfaces of circuit boards—including the interior surfaces of any holes, apertures or perforations formed therein.

BRIEF DESCRIPTION OF THE INVENTION

The present invention overcomes the aforestated shortcomings of the prior art by providing an apparatus capable of (a) extracting liquid from all surfaces of a circuit board including any holes, apertures and/or perforations formed therein and (b) drying any liquid remaining on such surfaces of the board.

The circuit board drying apparatus of the present invention may be used separately and/or in connection with various types of circuit board manufacturing machines and processes, including but not limited to the method and apparatus of U.S. patent application Ser. No. 267,044.

A basic circuit board drying apparatus in accordance with the present invention may comprise a conveyor operative to move circuit boards along a predetermined path with at least one "aspirator" mounted near and/or otherwise associated with a first location on the conveyor. Additionally, at least one "blower" is operative to circulate drying air over the circuit boards as they pass along the conveyor. The aspirator portion of the device is operative to extract excess liquid from the circuit boards as they move past a first location on the conveyor. The "blower" portion of the device is operative to provide drying air to the circuit boards as they continue to move along the conveyor.

The "aspirator" portion of the device may comprise one or more intake ducts positioned adjacent the conveyor path and having aspiration port(s) formed therein. A fan or other means for creating negative pressure will be connected to the intake duct(s) so as to create negative pressure within the interior of the intake duct(s). The creation of such negative pressure within the intake duct(s) will result in air being drawn through the aspiration port(s) at sufficient velocity to effectively extract liquid from apertures and/or surfaces of the circuit boards as the circuit boards pass over at least the first location of the conveyor. Accordingly, a preferred aspiration port may comprise a narrow, slit-like aperture formed in the intake duct. Such narrow, slit-like aperture will be sized and positioned to concentrate the suction emanating therefrom to a narrow portion or "slice" of the circuit board in time. Of course, as the circuit board continues along the conveyor path, the entire surface of the board will eventually pass through the suction force, even though the aspiration port is sized to directly suction only a narrow portion of each board at any one time. Additionally, one or more drains may be formed in the intake ducts(s) so as to drain away or discard at least a portion of any liquid drawn into the intake duct(s).

The present invention advantageously avoids problems associated with conventional drying circuits which utilize blowers. It has been determined that such blowers are frequently a common cause of streaking and surface marring of the circuit boards. By use of the present invention sufficient liquid may be initially extracted or evaporated from the surfaces of the boards to allow further drying of the board by conventional direct blowing means without problems of smearing or surface marring as may occur if air is blown directly upon the fully liquid film. Although metering rollers or other film regulating devices may be used in conjunction with the aspirator/blower combination of the present invention, it is to be understood that such additional components are optional.

In embodiments where the invention incorporates a cooperative "blower", the "blower" portion of the apparatus may comprise one or more air output ducts having outlet port(s) or apertures formed therein. Such air outlet duct(s) will be positioned so that air emanating from the outlet port(s) will come in contact with the circuit boards as they move along the conveyor. A fan or other means for creating positive pressure will be connected to the air output duct(s) and, when energized, will result in the expulsion of air through the air supply port(s). In many embodiments of the invention, it will be unnecessary for the blower to forceably blow air into the advancing circuit boards. Indeed, it will often be sufficient for the "blower" portion of the apparatus to simply circulate a flow of relatively dry air over the surfaces of the circuit board as to effectuate drying of the boards as they pass along the conveyor path. Of course, where required, air exiting the blower will directly impinge against the surfaces of the advancing circuit boards.

The negative pressure source which draws air into the "aspirator" and the positive pressure source which forces air out of the "blower" may comprise one or more pumps, impellers, fans or other devices capable of moving sufficient volumes of air at sufficient velocities to achieve the required aspirating and/or blowing effects. It will be recognized that a single fan unit may function as both the negative pressure source and the positive pressure source. To wit: the "aspirator" portion of the apparatus is connected to the intake side of the fan and the "blower" portion of the apparatus will be connected to the output side of the fan, thereby enabling a single fan to operate both the "aspirator" and "blower" portions of the apparatus.

In some applications it may be desirable to utilize two (2) or more "blowers" in conjunction with each "aspirator". For example, in applications where it is not requisite to avoid streaking or rippling of a liquid film, (e.g. where it is desired to merely remove or evaporate rinse water from the surfaces of a circuit board) it may be desirable to position a pre-blower or air knife ahead of the aspirator to accomplish an initial removal of excess water from the board surfaces. Such optional preblower may be operative to blow ambient room air.

Optionally, the dryer apparatus of the present invention may be enclosed in a substantially air tight housing or cabinet. Such enclosure of the dryer apparatus will permit air to recirculate wholly within the housing, thereby obviating any need for exterior venting, make-up air ducts, etc. The provision of such substantially air-tight housing will enable the apparatus to function in a substantially self-contained fashion.

Also, at least one dehumidifier may be provided to collect, condense or remove liquid/vapor from air as it is circulated through the aspirator and/or blower portion(s) of the apparatus. Such dehumidifier will generally serve to dehumidify the drying air which emanates from the "blower" portion of the apparatus, thereby increasing the efficiency of the drying of circuit boards within the apparatus.

Additionally, one or more specialized "squeegee" or metering rollers may be positioned on the conveyor path so as to assist in dispursing or leveling liquid upon the surfaces of the circuit boards and to push away and/or otherwise remove at least some of any excess liquid from surface of the circuit boards. Such optional metering roller(s) may comprise standard, cylindrical, rigid roller cores which may or may not be covered with a chamois-like or other absorbant material capable of evenly dispersing, leveling and/or absorbing excess liquid from the surfaces of the boards.

DETAILED DESCRIPTION OF THE PREFERRED EMBODIMENT

The following detailed description and the accompanying drawings are provided for purposes of illustrating and describing a presently preferred embodiment of the invention and are not intended to limit the scope of the invention in any way.

Figure 1:
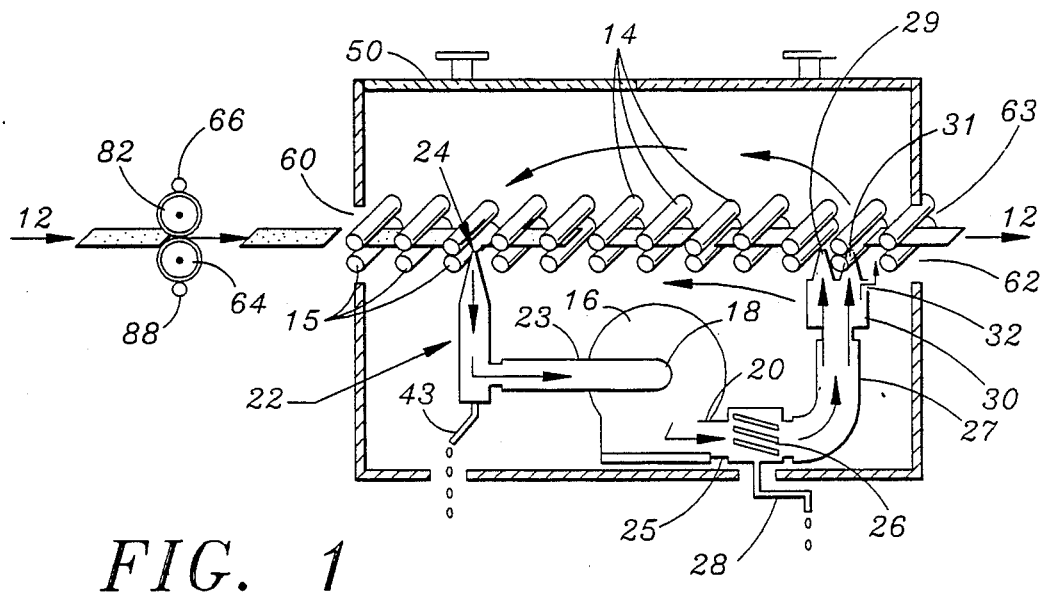
FIG. 1 is a schematic diagram illustrating the manner in which the functional components of the present invention interact to accomplish the drying of printed circuit boards as the printed circuit boards pass along a conveyor.

As shown in the schematic diagram of FIG. 1, one embodiment of a circuit board dryer apparatus of the present invention comprises, generally, a circuit board conveyor 12 whereby circuit boards 14 are carried along a fixed conveyor path. A housing enclosed fan 16 (e.g. turbine type blower) is positioned below the conveyor 12. Such fan 16 is provided with an air inlet 18 and an air outlet 20.

A primary air intake duct 22 is connected to secondary air intake duct 23. The secondary intake duct 23 is connected to the air inlet 18 of fan 16 such that when fan 16 is energized, air will be pulled through the aspiration port 24 located on the distal end of primary intake duct 22, subsequently through secondary intake duct 23 and into the inlet 18 of fan 16.

Quantities of aspirated liquid will gather in the bottom of primary intake duct 22 and may be drained through primary duct drain 43.

Figure 3:
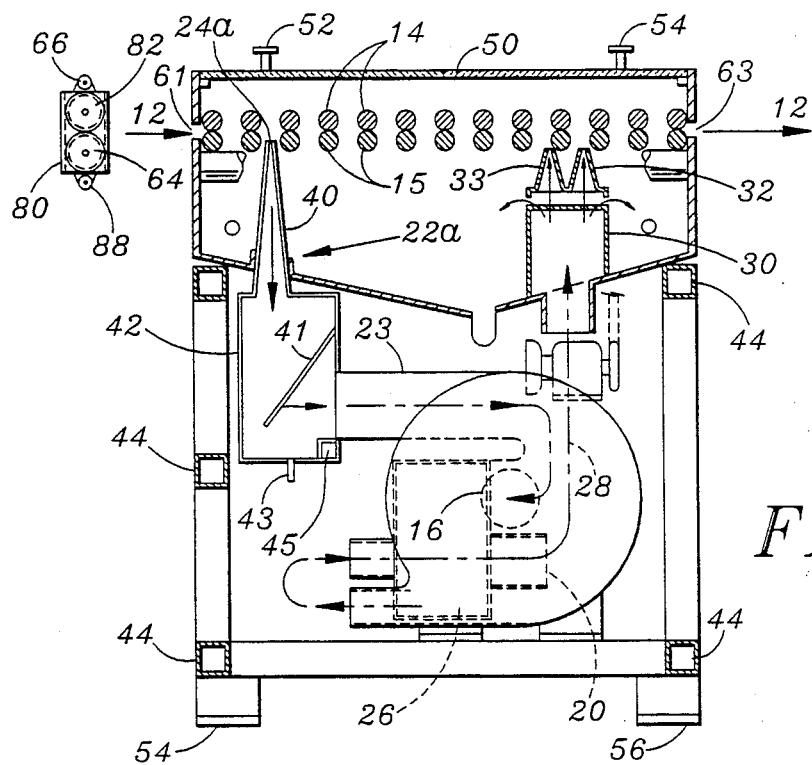
FIG. 3 is an elevational, cross-sectional view of a preferred circuit board drying apparatus of the present invention.

The positioning and configuration of the primary intake duct 22 and aspiration port 24 are shown in FIG. 3. Indeed, the distance between the aspiration port 24 and the surfaces of the passing circuit boards 14, as well as the velocity of air intake through aspiration port 24 (i.e. "face velocity") will determine, to a large extent, the efficacy of the aspirator in suctioning liquid from the circuit board 14 surfaces. It is preferable that the aspiration port 24 of the preferred embodiment be positioned within 1/32" to ⅛" of the passing circuit boards to effect the desired extraction of liquid therefrom. Additionally, the presence of conveyor rollers 14, 15 on either side of the aspiration port 24 will serve to minimize decentralization of the suction force and, hence, will effectively channel and confine the suction force within a specific region adjacent the convyor, thereby increasing the efficiency of the aspirator in extracting liquid from the circuit boards 14.

As is clearly shown in the cross-sectional representation of FIG. 3, increased face velocity at the aspiration port 24 may be achieved through the use of a tapered and/or dual-chambered air intake duct 22a. In the preferred embodiment shown in FIG. 3, the air intake duct 22a is configured so as to be divisible between upper 40 and lower 42 chambers or portions. The lower chamber 42 of the air intake duct 22a is of substantially greater volume than the comparatively narrow upper chamber 40 thereof.

A diagonal baffle plate 41 is positioned inside the lower chamber 42 and functions to guide the flow of air being aspirated through the air intake system. A block or filit 45 is formed in one corner of the lower chamber 42, as shown, to assist in guiding the aspirated air as it passes from the lower chamber 42 into the secondary intake duct 23.

Extracted liquid will collect in the bottom of the lower chamber 42. Such liquid is drained away through intake duct drain 43.

Air exiting the outlet 20 of fan 16 may be slightly heated due to warmth imparted by the moving parts of the fan 16.

Air exiting the output port of fan 16 will pass through primary output duct 25 and into a heater box or dehumidification chamber 26. In this preferred embodiment the dehumidification chamber 26 comprises a stainless steel box of approximately 8 in. × 10 in. × 10 in. having electrical resistance heating elements disposed therein so as to cause heating and dehumidification of the air as it passes through the box. In this preferred embodiment three (3) 1.2 kw heating elements 27 are employed. However, any heat-imparting elements sufficient to carry out the desired dehumidification function may be utilized in place of the spiral heating elements shown.

Following dehumidification, the drying air then proceeds through secondary air output duct 28 and is expelled through air output ports 30, 32, 33.

The positioning and configuration of the secondary output duct 28 and air output ports 29, 31, 32 are also shown in FIG. 3. The secondary output duct 28 is provided with an enlarged region 30 at its digital end. Two tapered, wedge-shaped extensions are formed on the top side of enlarged region 30. First and second air output ports 29, 31 are formed at the distal tips of the wedge-shaped extensions. Such first and second air output ports 29, 31 preferably comprise slit-like openings of approximately 1/16" to ¼" across their shortest dimension (i.e. along the longitudinal axis of the conveyor). These slit-like openings of first and second air output ports 29 and 31 may extend across the entire transverse width of the conveyor or may be confined to a narrower region, as desired, so long as they carry out the desired drying function of the apparatus. In the preferred embodiment shown in FIGS. 3 and 4, the first and second air output ports 29, 31 are approximately coextensive with the width of rollers 14, 15, thereby traversing nearly the entire width of the conveyor.

Additionally, first and second air output ports 29 and 31 are positioned between neighboring lower rollers 15 so as to blow drying air directly onto the bottom sides of advancing circuit boards. The output ports 29 and 31 are positioned about ⅛" below the conveyor path and the tapered configurations of the duct projections leading to output ports 29, 31 serve to increase the velocity of drying air exiting the output ports 29, 31 and impinging against the circuit board surface.

The dryer apparatus of the present invention may be fully enclosed in a substantially air tight housing so as to permit continual recirculation of air within the housing, intake or exhaust of air from/into areas outside the housing. Such will obviate any need for exterior venting, exterior make up air ducts or other plumbing leading into or out of the housing. As shown, in the preferred embodiment, the lower portion of such housing may consist of a tubular frame 44 with sheet metal panels 46, 48 disposed thereon so as to form an enclosure about thes lower portion of the dryer apparatus. A removable lid 50 of glass or metal is mounted on top of the lower cabinet portion so as to complete the substantially air tight housing enclosure. The lid 50 is provided with handles 52, 54 to facilitate removal and/or placement of the lid as desired.

A control panel 56 extends from the frontal portion of the housing near the top thereof. Such control panel incorporation a thermometer 58 and on/off switch 60 with corresponding on/off light 62. The thermometer 58 is connected to a thermocouple or other temperature sensor mounted inside the interior of the housing so as to continually monitor the temperature of air recirculating in the area of the conveyor 12. Of course, other instruments may also be mounted on the instrument panel for purposes of measuring other variables of interest, such as relative humidity within the housing, etc.

Figure 4:
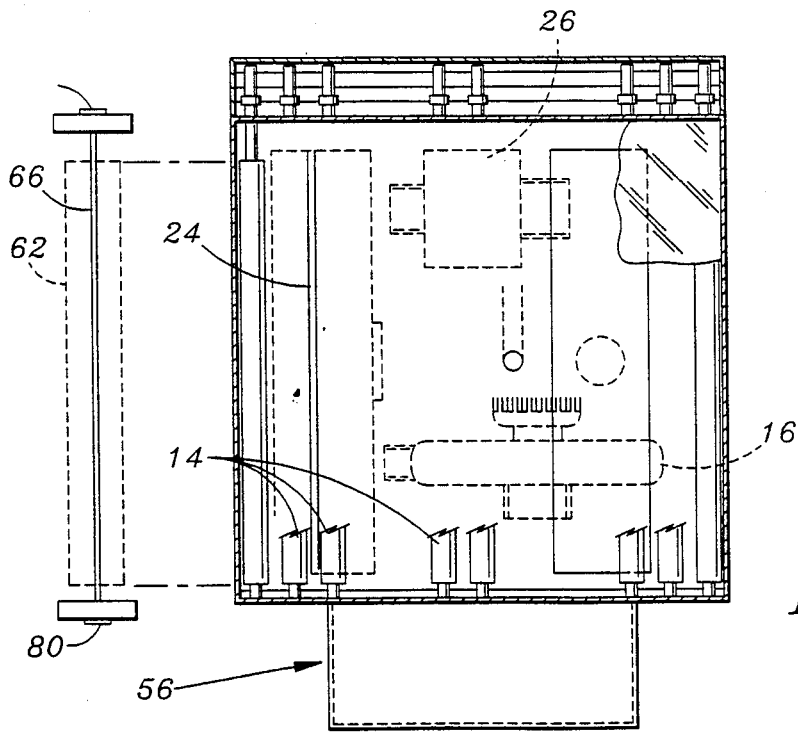
FIG. 4 is a top plan, cross-sectional view of a preferred circuit board drying apparatus of the present invention.

Optionally, one or more metering rollers may be positioned on the conveyor path, just ahead of the dryer apparatus, to assist in leveling and/or extracting liquid from the surfaces of the circuit boards. As shown in FIGS. 3 and 4 (dotted lines) the optional metering rollers 82, 84 may be attached to mounting brackets 80, 81 mountable on the input side of the conveyor path 12. When attached to mounting brackets 80, 81, the upper metering roller 82 is positioned in direct vertical alignment with the lower metering roller 84.

Both metering rollers 82, 84 may or may not be covered with chamois-like, silicone-free natural fiber coverings (e.g. Vileda, Vileda GMBH, West Germany) or other material(s) capable of evenly distributing and/or absorbing liquid disposed on the surfaces of the circuit boards as they pass between and come in contact with metering rollers 82, 84.

In embodiments utilizing metering rollers 82, 84 with absorbant outer coverings a pair of compression bars 86, 88 traverse between and are connected at either end to mounting brackets 80, 81. The compression bars 86, 88 are mounted above and below metering rollers 82, 84 respectively. Such compression bars are positioned in compressive contact with the absorbant outer coverings of metering rollers 82, 84 and serve to continually compress and squeeze liquid from the chamois-like covers of the rollers 82, 84 as they rotate. Thus, these compression bars 86, 88 serve to squeeze excess liquid from the roller coverings as the metering rollers 82, 84 undergo opposite rotational movements, thereby renewing the absorptive capabilities of the absorbant roller coverings on a continuing basis.

It is preferable that the chamois-like coverings be readily separable and removable from the rigid cores of the metering rollers 82, 84 so as to permit replacement of the chamois-like coverings when they become soiled or worn.

One or more of the metering rollers may be operatively connected to a drive motor to cause rotational movement thereof. Similarly, some or all of the conveyor rollers 14, 15 may be connected to the same or a different drive motor so as to cause rotational movement of the conveyor rollers, thereby propelling the circuit boards along the conveyor path. In the particular embodiment shown in FIGS. 3-4 an electric motor (e.g. variable speed AC or DC type) is mounted within the device and is operative to drive 10 to 60 pairs of conveyor rollers.

i. Operation of the Preferred Embodiment

In accordance with the typical operation of the above-described preferred embodiment, wet/liquid covered circuit boards 14 will pass along the conveyor 12 at a generally constant and fixed rate. Each circuit board 14 will be positioned in a generally horizontal plane so as to pass between upper rollers 14 and lower rollers 15 of the conveyor assembly.

Initially, before entering the dryer module, the circuit boards 14 will pass between "squeegee" or metering rollers 82, 84. As the circuit boards pass between the metering rollers 82, 84, the upper metering roller 82 will turn in a counterclockwise direction (FIG. 3) and the lower metering roller 84 will turn in a counterclockwise direction (FIG. 3).

After passing between the metering rollers 82, 84 the circuit boards 14 will pass through opening 64 formed within the sidewall of the dryer cabinet. The circuit boards 14 will then continue to be passed in longitudinal progression between upper rollers 14 and lower rollers 15, thereby advancing through the interior of the dryer module.

As the advancing circuit boards 14 pass directly over the aspiration port 24, 24a the suction force created thereby will suck liquid from the surfaces and/or apertures of the circuit boards 15 into the interior of intake duct 22. The water and air drawn through intake duct 22 will pass through intake fan 16 and be expelled into the first air output duct 24. The liquid aspirated through intake duct 22 will thereafter be removed in dehumidification chamber 26 and will be drained away through drainpipe 28. The dehumidified air will then continue through second air ouput duct 28 and be expelled through ouput ports 29, 31 and 32. Dry air emanating from ouput ports 29 and 31 will impinge directly against the surface of circuit boards as they pass adjacent thereto on the conveyor 12. Dry air emanating from the dry air will then circulate (arrows "A") through the interior of the dryer module cabinet. As the circuit boards continue to pass along the conveyor path 12, the dry air circulating within the dryer module cabinet will effect complete evaporation of any liquid remaining thereon.

Thus, as the circuit boards 14 emerge through outlet opening 63 in the dryer module cabinet wall, they will be substantially dry and ready for further processing and or storage.

ii. Incorporation of the Dryer Apparatus of the Present Invention into the "Device for Sequential Spray Application of Chemical Solutions Used in the Preparation of Circuit Board Inner Layers" of U.S. application Ser. No. 267,044

In accordance with the present invention, it is contemplated that the above-described preferred embodiment may be directly incorporated into the device of U.S. patent application Ser. No. 267,044, of which the present application is a continuation in part.

In incorporating this dryer apparatus into the "Device for Sequential Spray Application of Chemical Solutions Used in the Preparation of Circuit Board Inner Layers" it will be recognized that the addition of the independent dryer apparatus or "module" will result in the formation of a fourth major enclosure. Thus, when the dryer apparatus of the present invention is incorporated into the device of U.S. application Ser. No. 267,044, the resultant processing line will consist of four, rather than three, major enclosures.

Figure 2:
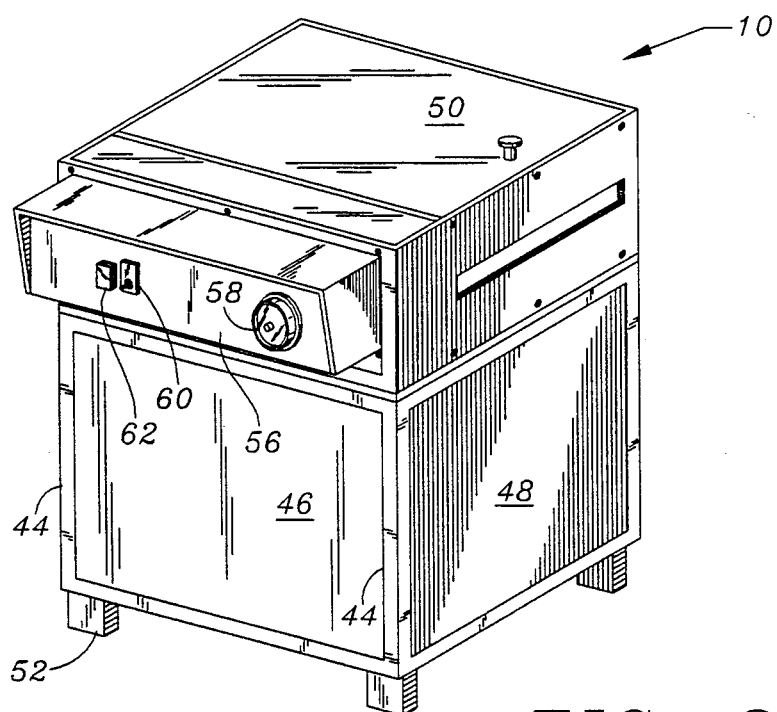
FIG. 2 is a perspective view of a preferred circuit board drying apparatus of the present invention.

Referring specifically to FIG. 2d of application Ser. No. 267,044, it will be appreciated that, when the dryer apparatus of the present invention is added thereto, it will likely be expedient to delete the portion of the processing line lying to the right of partition 228. Thus, partition 228 will form the end of the third major enclosure after the device has been modified to receive the dryer module.

The specialized "squeegee" or metering rollers 231 will remove excess liquid, solvent carried silane solution (e.g. DuraBond⊥ PT) from the surface of the inner layers as they advance along the conveyor. Such metering rollers 231 will also serve to distribute liquid silane solution upon the inner layer surface at a preferred uniform thickness of approximately 1/10 to 1 mils.

After passing between metering rollers 231, the advancing inner layers, having uniform liquid silane solution films of approximately 1/10 to 1 mils thickness disposed thereon, will pass into the dryer apparatus of the present invention, such as that shown in FIGS. 3 and 4. The suction velocity and positioning of the "aspirator" portion of the dryer apparatus will be adjusted to evaporate at least some of the carrier solvent from the liquid silane film without causing disruption of the uniformity and thickness of such liquid film. Thereafter, the "blower" portion of the dryer apparatus will serve to pass drying air over the surfaces of the advancing inner layers so as to complete drying of the silane film thereon. As a result, the inner layers will exit the dryer apparatus bearing a substantially dry silane film of approximately 1/10 to 1 mils thickness and of substantially even and uniform integrity.

Although the invention has been described herein with reference to a presently preferred embodiment, it will be appreciated that various alterations, modifications and additions may be made to such preferred embodiment without departing from the intended spirit and scope of the invention. For example, various multiple or singular fans, blowers or other devices may be utilized to effect the desired movement of air within the intake and output ducts of this apparatus. Similarly, various types of conveyors may be employed to move the circuit boards through the device and the possible types of conveyor construction usable in connection with the present invention are in no way limited to the specific opposing roller type of conveyor described in the preferred embodiment and shown in the drawings. Further, certain structural elements described herein (e.g. the substantially air-tight enxlosure and/or the "blotting rollers") are to be viewed as an optinal aspect of the invention and need not be specifically incorporated in any basic dryer apparatus of the present invention. Accordingly, in themselves, critical to the central inventive concept. Thus, it is intended that any and all such additions, modifications and alterations be construed as falling within the scope of the following claims and the equivalents thereof.

What is claimed is:

1. A circuit drying apparatus comprising:
   a conveyor operative to move a circuit board along a predetermined conveyor path;
   an aspirator operative disposed at a first location adjacent said conveyor path, and aspirator being operative to extract liquid from circuit board surfaces as the circuit board moves past said first location;
   a blower disposed at a second location adjacent said conveyor path downstream of said first location, said blower being in fluid communication with said aspirator and operative to direct drying air over the circuit board as it moves along said conveyor path; and
   at least one drain in fluid communication with said aspirator for draining away liquid extracted by said aspirator.

2. The circuit board drying apparatus of claim 1 wherein said drain for draining away liquid extracted by said aspirator is formed within said aspirator.

3. The circuit board drying apparatus of claim 1 wherein said "blower" comprises:
   at least one air output duct having an air output port formed therein,
   said blower being connected to said air output duct in such a manner as to expel air into said air output duct and out of said air output port.

4. The circuit board drying apparatus of claim 1 further comprising:
   a substantially air-tight enclosure disposed about said aspirator, said blower and at least a portion of said conveyor;
   said enclosure being operative to contain air within said enclosure and to thereby facilitate recirculation of air between said "blower" and "aspirator" and to minimize escape of said recirculated air from said enclosure.

5. The circuit board drying apparatus of claim 1 wherein said apparatus further comprises:
   at least one metering roller comprising a rigid roller core having a quantity of soft, pliant material disposed on the outer surface thereof;
   said metering roller being positioned adjacent said conveyor path so that the material disposed thereon will contact the circuit board as it moves along said conveyor path.

6. The circuit board drying apparatus of claim 1 wherein said "aspirator" comprises:
   at least one air intake duct having an aspiration port formed therein, said aspiration port being positioned at said first location adjacent said conveyor path;
   a negative pressure generating device connected to said at least one air intake duct and operative to create negative pressure therewithin so as to extract liquid through said aspiration port from the circuit board surfaces as said circuit board moves along said conveyor path past said first location.

7. The circuit board drying apparatus of claim 6 wherein said negative pressure generating device is connected to said air intake duct in such a manner as to extract air from an interior portion of said air intake duct, thereby causing air to be drawn through said aspiration port at sufficient velocity to effectuate extraction of liquid from the passing circuit boards.

8. The circuit board drying apparatus of claim 2 wherein said air intake duct is configured so as to be divisible into at least first and second chambers, said aspiration port being located in said first chamber and said second chamber being of greater volume than said first chamber, thereby augmenting the face velocity of air being drawn through said aspiration port.

9. The circuit board drying apparatus of claim 6 wherein at least a portion of said air intake duct is of tapered configuration whereby the volumetric capacity of the duct in the region of said aspiration port is less than the volume of the remainder of said duct, thereby increasing the face velocity of air drawn through said aspiration port.

10. The circuit board drying apparatus of claim 1 further comprising:
    a dehumidifier in fluid communication with said blower for removing liquid from said drying air emanating from said blower.

11. The circuit board drying apparatus of claim 10 wherein said dehumidifier comprises a box enclosure having heating elements to heat said drying air to a temperature.

12. The circuit board drying apparatus of claim 10 further comprising:
at least one drain in fluid communication with said dehumidifier for draining away liquid removed from said drying air by said dehumidifier.

13. A device for evenly metering and drying a liquid, solvent carried, silane solution upon surfaces of circuit board layers moving along a predetermined conveyor path, said appratus comprising:
at least one metering roller disposed at a first location adjacent said conveyor path, operative to remove excess liquid from said surfaces such that a film of liquid silane remains thereon said film being approximately 1/10 to 1 mils thick;
an aspirator disposed at a second location adjacent said conveyor path, said aspirator being operative to partially evaporate said carrier solvent from said silane film without causing disruption of the uniformity and thickness of said liquid film;
a blower disposed at a third location adjacent said conveyor path downstream of said second location, said blower being in fluid communication with said aspirator and operative to direct drying air over said surfaces to finish drying of said film, thereby providing a uniformed dry silane film over approximately 1/10 to 1 mils thickness upon said surfaces; and
at least one drain in fluid communication with said aspirator for draining away liquid extracted by said aspirator.

14. The device of claim 13 wherein said at least one metering roller comprises a rigid roller core having a quantity of soft, pliant material disposed on the outer surface thereof.

15. The device of claim 14 wherein said soft, pliant material comprises a silicone free, natural fiber material.

16. The device of claim 13 wherein said at least one metering roller comprises a rigid roller core having a quantity of elastomeric material disposed on the outer surface thereof.

17. The device of claim 16 wherein said elastomeric material is selected from the group consisting of: PVC, rubber, neoprene.

18. An apparatus for facilitating drying of a liquid, solvent, carried, silane solution upon the surfaces of a circuit board layer, said apparatus comprising:
an aspirator connectable to a circuit board layer transport apparatus for sequentially receiving circuit board layers having a liquid silane film disposed thereon, said aspirator being disposed at a first location adjacent said transport apparatus and operative to partially evaporate said carrier solvent from said silane film while substantially maintaining film uniformity and thickness, said aspirator further being in fluid communication with a blower disposed at a second location adjacent said transport apparatus downstream of said first location, said blower being operative to direct drying air toward said circuit board layer to dry said film; and
at least one drain in fluid communication with said aspirateor for draining away liquid extracted by said aspirator.

19. The device of claim 18 wherein said aspirator comprises:
at least one air intake duct having an aspiration port formed therein, said aspiration port being positioned at said first location in abutting contact with said transport apparatus;
a negative pressure generating device connected to said air intake duct and operative to create negative pressure therewithin so as to extract liquid through said aspiration port for the circuit boards as they move past said first location.

20. The device of claim 18 wherein said blower comprises:
as least one air ouput duct having an air output port formed therein,
said blower being connected to said output duct in such a manner as to expel air into said air output duct and out of said air output port.

21. A circuit board drying apparatus comprising:
a conveyor operative to move a circuit board along a predetermined conveyor path;
an aspirator disposed at a first location adjacent said conveyor path, said aspirator being operative to extract liquid from said circuit board surfaces as the circuit board moves past said first location;
a blower disposed at a second location adjacent said conveyor path downstream of said first location, said blower being in fluid communication with said aspirator and operative to direct drying air over the circuit board as it moves along said conveyor path;
at least one drain in fluid communication with said aspirator for draining away liquid extracted by said aspirator; and
a substantially air-tight exterior housing formed around said circuit board drying apparatus and operative to cause substantial recirculation of air within said circuit board drying apparatus without substantial air leakage to areas outside said housing.

* * * * *

UNITED STATES PATENT AND TRADEMARK OFFICE
CERTIFICATE OF CORRECTION

PATENT NO. : 4,996,939
DATED : March 5, 1991
INVENTOR(S) : Mark D'Amato

It is certified that error appears in the above-identified patent and that said Letters Patent is hereby corrected as shown below:

In column 3, line 33, after "board", insert --at any given--.

Column 7, line 1, delete "incorporation" and insert therefore --incorporates--.

In column 9, line 1 delete "↓" and insert therefore --$^{TM}$--.

In column 9, line 39, delete "enxlosure" and insert therefore --enclosure--.

In column 9, line 40, delete "optinal" and insert therefore --optional--.

UNITED STATES PATENT AND TRADEMARK OFFICE
CERTIFICATE OF CORRECTION

PATENT NO. : 4,996,939

DATED : March 5, 1991

INVENTOR(S) : Mark D'Amato

It is certified that error appears in the above-identified patent and that said Letters Patent is hereby corrected as shown below:

In column 9, line 53, delete "and" and insert therefore --said--.

In column 10, line 15, after "and" insert --said--.

In column 10, line 46, delete "2" and insert therefore --6--.

In column 12, line 10, delete "aspirateor" and insert therefore --aspirator--.

In column 12, line 27, after "said" insert --air--.

Signed and Sealed this

First Day of September, 1992

Attest:

DOUGLAS B. COMER

Attesting Officer

Acting Commissioner of Patents and Trademarks